United States Patent
Fletcher et al.

(10) Patent No.: US 11,373,861 B2
(45) Date of Patent: Jun. 28, 2022

(54) SYSTEM AND METHOD OF CLEANING MESA SIDEWALLS OF A TEMPLATE

(71) Applicant: CANON KABUSHIKI KAISHA, Tokyo (JP)

(72) Inventors: Edward Brian Fletcher, Austin, TX (US); Amir Tavakkoli Kermani Ghariehali, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 430 days.

(21) Appl. No.: 16/503,694

(22) Filed: Jul. 5, 2019

(65) Prior Publication Data

US 2021/0005446 A1 Jan. 7, 2021

(51) Int. Cl.
 *B08B 7/00* (2006.01)
 *H01L 21/02* (2006.01)
 *H01L 21/027* (2006.01)
 *G03F 7/00* (2006.01)

(52) U.S. Cl.
 CPC ...... *H01L 21/02082* (2013.01); *B08B 7/0014* (2013.01); *G03F 7/0002* (2013.01); *H01L 21/0271* (2013.01)

(58) Field of Classification Search
 CPC ............. H01L 21/02082; B08B 7/0014; G03F 7/0002
 See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 9,164,377 B2 | 10/2015 | Tomita et al. |
| 2010/0085555 A1 | 4/2010 | Schmid et al. |

(Continued)

FOREIGN PATENT DOCUMENTS

| | | |
|---|---|---|
| JP | 2013-8911 A | 1/2013 |
| JP | 2013229475 A | 11/2013 |
| JP | 2015223770 A | 12/2015 |

OTHER PUBLICATIONS

L. Jay Guo, Nanoimprint Lithography: Methods and Material Requirements, Advanced Materials, Feb. 9, 2007, 19(4):495-513, Wiley-VCH Verlag GmbH & Co. KGaA, Weinheim, Germany, 2007.

*Primary Examiner* — Sharidan Carrillo
(74) *Attorney, Agent, or Firm* — Daniel Ratoff

(57) ABSTRACT

A system and method for cleaning mesa sidewalls of a template. Curable material may be deposited in a cleaning drop pattern onto a non-yielding imprint field of one of: a device yielding substrate; and a non-yielding substrate. The template may be brought into contact with the curable material. The template has: a recessed surface; a mesa extending from the recessed surface; and wherein the mesa sidewalls connect the recessed surface to the mesa. A relative position of the template to the cleaning drop pattern may be such that the curable material spreads up the mesa sidewalls and does not contact the recessed surface. Cured material may be formed by exposing the curable material to actinic radiation after the curable material has spread up the mesa sidewalls, and before the curable material contacts the recessed surface. The template may be separated from the cured material.

8 Claims, 7 Drawing Sheets

(56) References Cited

U.S. PATENT DOCUMENTS

| | | |
|---|---|---|
| 2010/0096764 A1 | 4/2010 | Lu |
| 2010/0109205 A1 | 5/2010 | Fletcher |
| 2013/0064415 A1 | 3/2013 | Ota |
| 2014/0083454 A1 | 3/2014 | Wakamatsu |
| 2019/0101823 A1 | 4/2019 | Patel et al. |
| 2019/0377257 A1 | 12/2019 | Fletcher |
| 2020/0026183 A1 | 1/2020 | Fletcher |
| 2020/0379342 A1* | 12/2020 | Tavakkoli Kermani Ghariehali ............ G03F 7/0002 |
| 2021/0005446 A1* | 1/2021 | Fletcher ................ G03F 7/0002 |

* cited by examiner

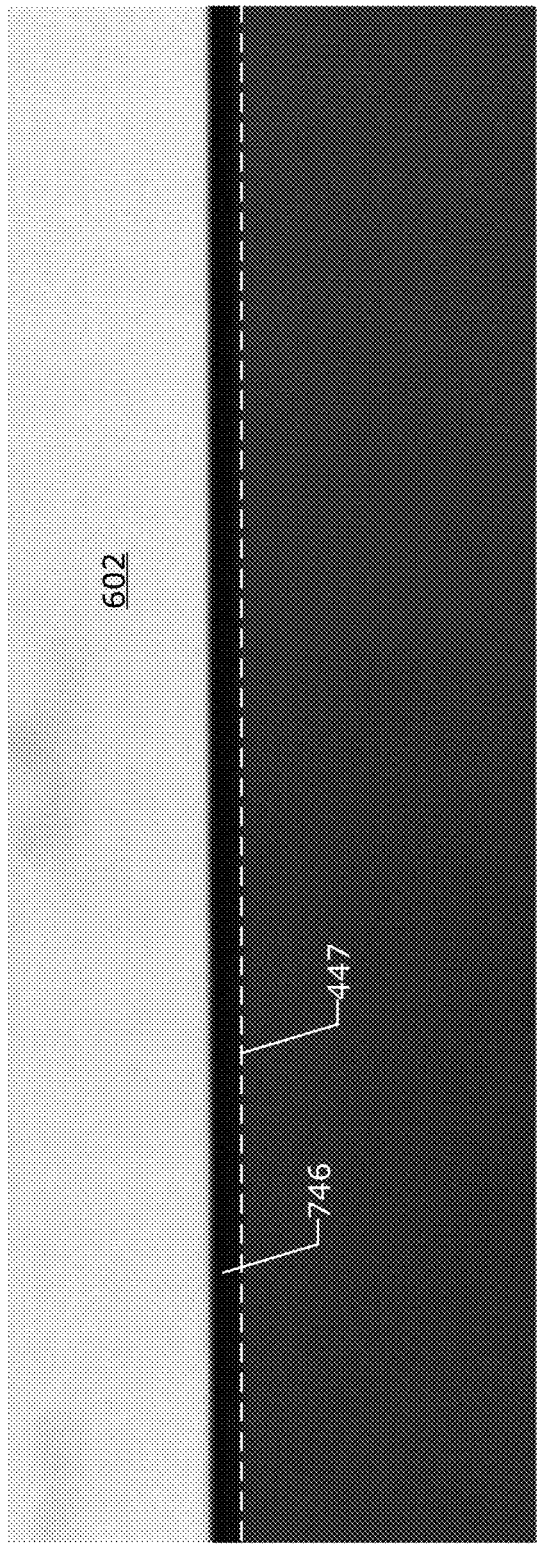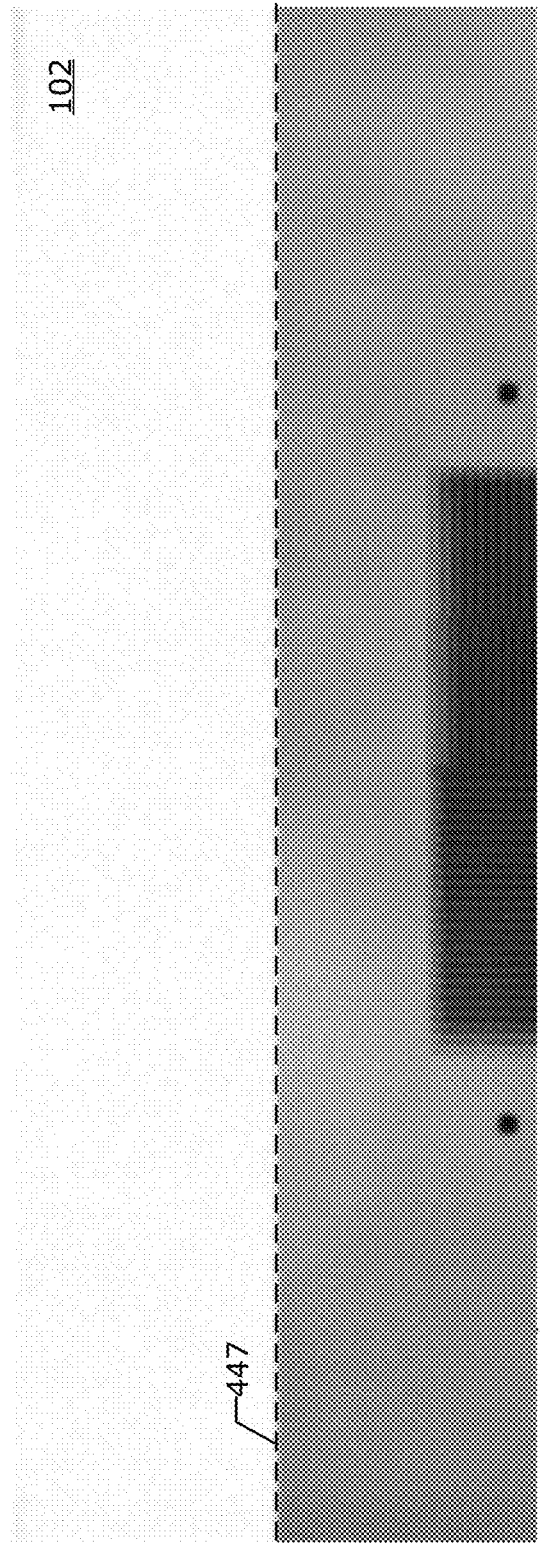

SYSTEM AND METHOD OF CLEANING MESA SIDEWALLS OF A TEMPLATE

BACKGROUND

Field of Art

The present disclosure relates to systems and methods of cleaning mesa sidewalls of a template.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional semiconductor fabrication processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

A first embodiment, may be a method configured to clean mesa sidewalls of a template. The method may comprise depositing a curable material in a cleaning drop pattern onto a non-yielding imprint field of one of: a device yielding substrate; and a non-yielding substrate. The method may further comprise contacting the curable material with the template. The template has: a recessed surface; a mesa extending from the recessed surface; and the mesa sidewalls connect the recessed surface to the mesa. A relative position of the template to the cleaning drop pattern may be such that the curable material spreads up the mesa sidewalls and does not contact the recessed surface. The method may further comprise forming cured material by exposing the curable material to actinic radiation after the curable material has spread up the mesa sidewalls, and before the curable material contacts the recessed surface. The method may further comprise separating the template from the cured material.

The first embodiment, may further comprise imprinting a plurality of device yielding imprint fields on a plurality of the device yielding substrates. Imprinting a particular device yielding imprint field on a particular device yielding substrate may comprise depositing formable material onto the particular device yielding imprint field. Imprinting may further comprise contacting the formable material with the template. Imprinting may further comprise exposing the formable material to actinic radiation to form cured formable material on the device yielding substrate and contaminating the mesa sidewalls with cured formable material. Imprinting may further comprise separating the template from the cured formable material. Prior to the template contacting the curable material, the mesa sidewalls may be contaminated with a first amount of the cured formable material. After the template is separated from the cured material, the mesa sidewalls may be contaminated with less than the first amount of the cured formable material.

In an aspect of the first embodiment, the cured formable material contaminating the mesa sidewalls may be a result of the template being used for imprinting the formable material on the plurality of device yielding imprint fields on one or more of the device yielding substrates among the plurality of device yielding substrates.

In an aspect of the first embodiment, the curable material may be identical to the formable material.

In an aspect of the first embodiment, the first amount of the cured formable material may be template extrusions from previous imprinting steps, and the cured material forms a line extrusion along the mesa sidewalls.

In an aspect of the first embodiment, the template extrusions may have a height between 200 nm to 2 µm.

In an aspect of the first embodiment, the line extrusions may have a width of 1-4 µm.

In an aspect of the first embodiment, the line extrusions may have a height that is less than half a mesa height of the template and greater than a height of the template extrusions.

The first embodiment, may further comprise manufacturing a plurality of devices by processing the particular device yielding substrate with semiconductor manufacturing processing steps to produce the plurality of devices.

In an aspect of the first embodiment, the non-yielding substrate may be a semiconductor wafer.

A second embodiment, may be a system configured to clean mesa sidewalls of a template. The system may comprise a template chuck configured to hold the template. The template may have: a recessed surface; a mesa extending from the recessed surface; and the mesa sidewalls may connect the recessed surface to the mesa. The system may further comprise a substrate chuck configured to hold one or both of: a device yielding substrate; and a non-yielding substrate. The system may further comprise a fluid dispenser configured to deposit a curable material in a cleaning drop pattern onto a non-yielding imprint field of one or both of: the device yielding substrate; and the non-yielding substrate. The system may further comprise a positioning system configured to bring the template into contact with the curable material. A relative position of the template to the cleaning drop pattern may be such that the curable material spreads up the mesa sidewalls and does not contact the recessed surface. The system may further comprise a radiation source configured to expose the curable material to actinic radiation forming cured material, after the curable material has spread up the mesa sidewalls, and before the curable material contacts the recessed surface. The positioning system may be further configured to separate the template from the cured material.

The second embodiment, may be further configured to imprint a plurality of device yielding imprint fields on the device yielding substrate. The fluid dispenser may be further configured to deposit formable material onto a particular device yielding imprint field. The positioning system may be further configured to contact the formable material with the template. The radiation source is further configured to expose the formable material to actinic radiation to form cured formable material and contaminate the mesa sidewalls with the cured formable material. The positioning system is further configured to separate the template from the cured formable material. Prior to the template contacting the curable material, the mesa sidewalls may be contaminated with a first amount of the cured formable material, and wherein after the template is separated from the cured material, the mesa sidewalls are contaminated with less than the first amount of the cured formable material.

In an aspect of the second embodiment, the curable material may be identical to the formable material.

In an aspect of the second embodiment, the first amount of the cured formable material may be template extrusions from previous imprinting steps, and the cured material may form a line extrusion along the mesa sidewalls.

In an aspect of the second embodiment, the template extrusions may have a height between 200 nm to 2 μm.

In an aspect of the second embodiment, the line extrusions may have a width of 1-4 μm.

In an aspect of the second embodiment, the line extrusions may have a height that is less than half a mesa height of the template and greater than a height of the template extrusions.

In an aspect of the second embodiment, the non-yielding substrate is a semiconductor wafer.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 8A is a micrograph illustrating a large line extrusion on a substrate as produced by an exemplary embodiment.

FIG. 8B is a micrograph illustrating an imprint field edge on a substrate that was produced by a template after being treated with an exemplary mesa sidewall cleaning process as used in an embodiment.

Figure 1:
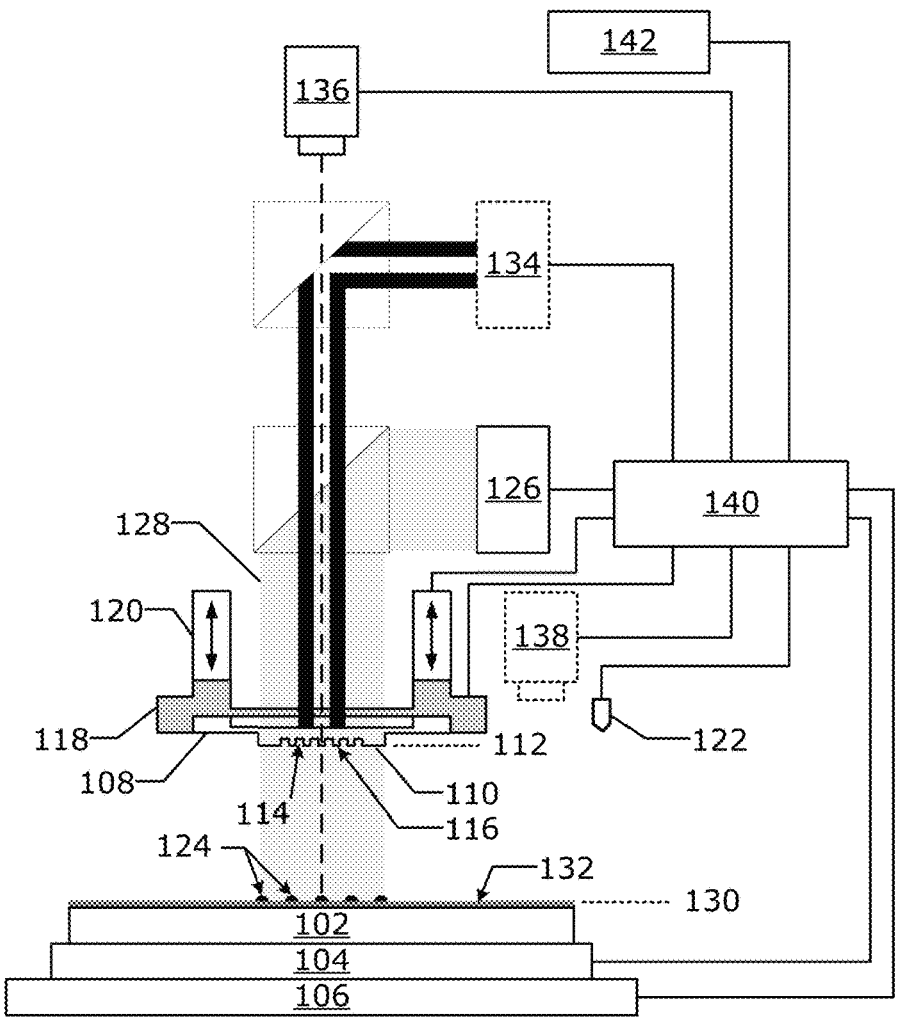
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique is used to shape a film on a substrate in a formable material. The shaping process includes bringing the template into contact with the formable material. The template includes a shaping surface on a mesa that extends above a recessed surface. The template also includes mesa sidewalls that surround the mesa and connect the mesa to the recessed surface. During the shaping process the formable material spreads due to capillary action and other forces such that the formable material spreads toward the mesa sidewalls during a spreading period. Extrusions form when formable material wets the mesa sidewalls during the shaping process. The shaping process is done repeatedly with a single template across one or more fields and across one or more substrates.

The applicant has found that these extrusions tend to start as small point extrusions that randomly form on the mesa sidewalls. The applicant has also found that once a point extrusion is formed it will tend to grow during subsequent shaping steps. Extrusions on the mesa sidewalls increase in number and size with increasing number of shaping steps. These extrusions tend to not create an issue until they reach a critical size at which point they are deposited onto the substrate and can create defects at the edge of the imprinting field. Extrusions adhere and transfer to the substrate during the shaping process. These extrusions can cause defects during process steps that follow shaping process and can ultimately lead to lower device yield.

Previously, extrusions were removed through chemical reactions which take place during dry and wet cleaning methods such as VUV, plasma, ozonated water, or piranha. Cleaning a template in this manner may require exchanging a template contaminated with extrusions with a clean template. Frequent exchange of templates, while improving yield, reduces overall throughput. This also requires that an increased number of clean templates be available.

What is needed is a method of removing these point extrusions before they reach a critical size, while also not substantially impacting throughput.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be, but is not limited to, a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 124. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track of the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields may overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
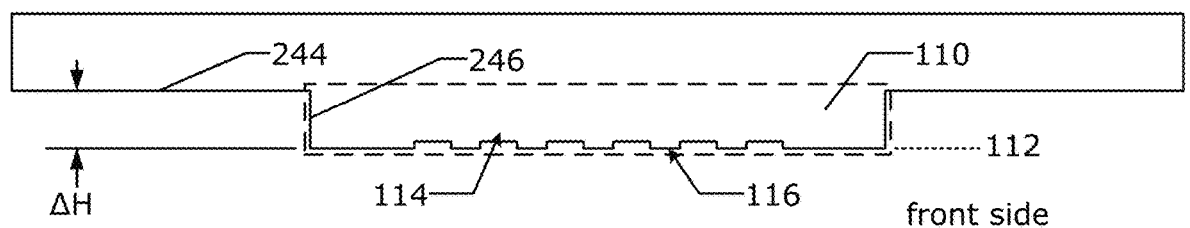
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners. The mesa extends a mesa height $\Delta H$ above the recessed surface 244. In an embodiment, the mesa height $\Delta H$ of the mesa is 30 μm. In an embodiment, the mesa height $\Delta H$ of the mesa is 15, 90, or 120 μm.

Imprinting Process

Figure 3:
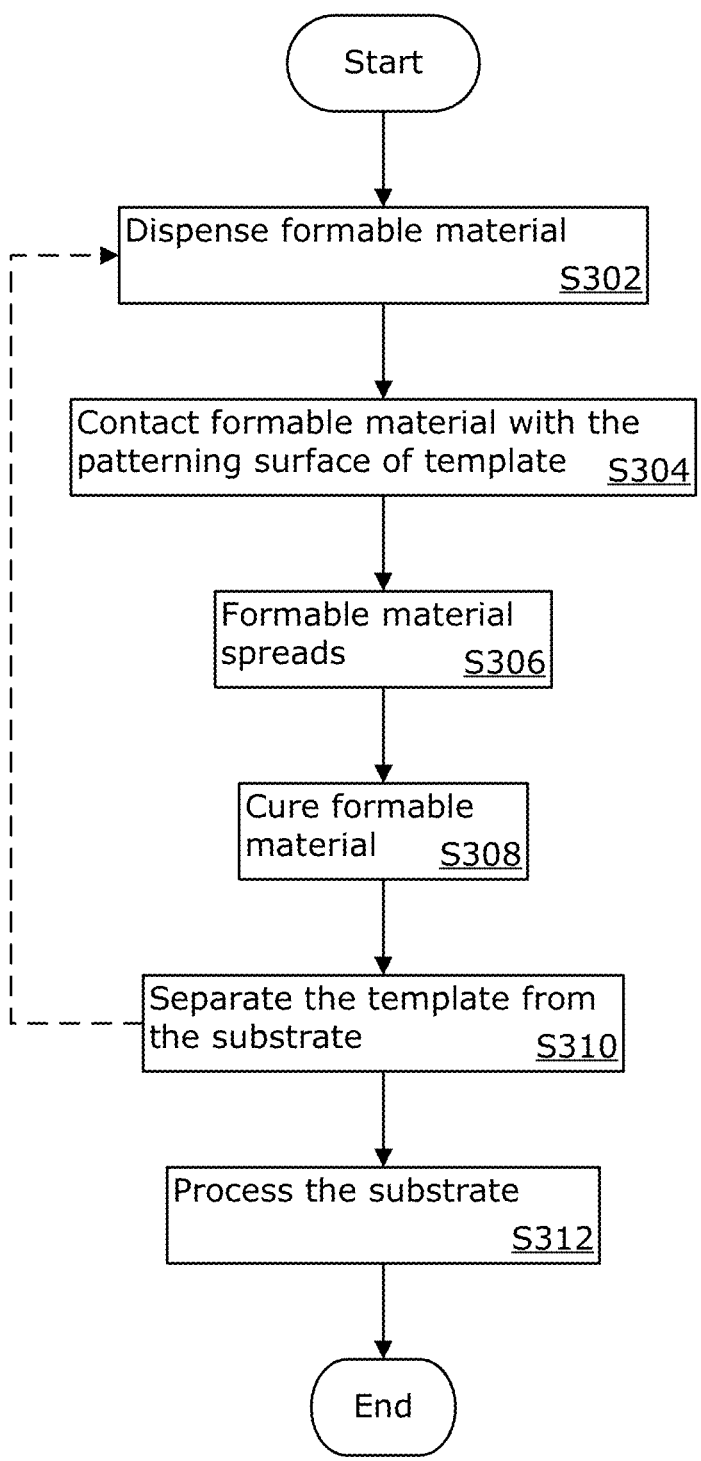
FIG. 3 is a flowchart illustrating an exemplary imprinting process as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with an imprinting drop pattern $P_I$. The imprinting drop pattern $P_I$ may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102. If there are additional imprint fields to be imprinted then the process moves back to step S302.

In an embodiment, after the imprinting process S300 is finished additional semiconductor manufacturing processing is performed on the substrate 102 in a processing step S312 so as to create an article of manufacture (e.g. semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, baking, oxidation, layer formation, deposition, doping, planarization, etching, formable material removal, thinning, dicing, singulation, bonding, packaging, and the like. The substrate 102 may be processed to produce a plurality of articles (devices). In an embodiment, one or more of the further processing steps are performed while the substrate 102 is on the substrate chuck 104 and within the nanoimprint lithography system 100. In an embodiment, all of the processing steps are performed outside of the nanoimprint lithography system 100.

Extrusions

Figure 4:
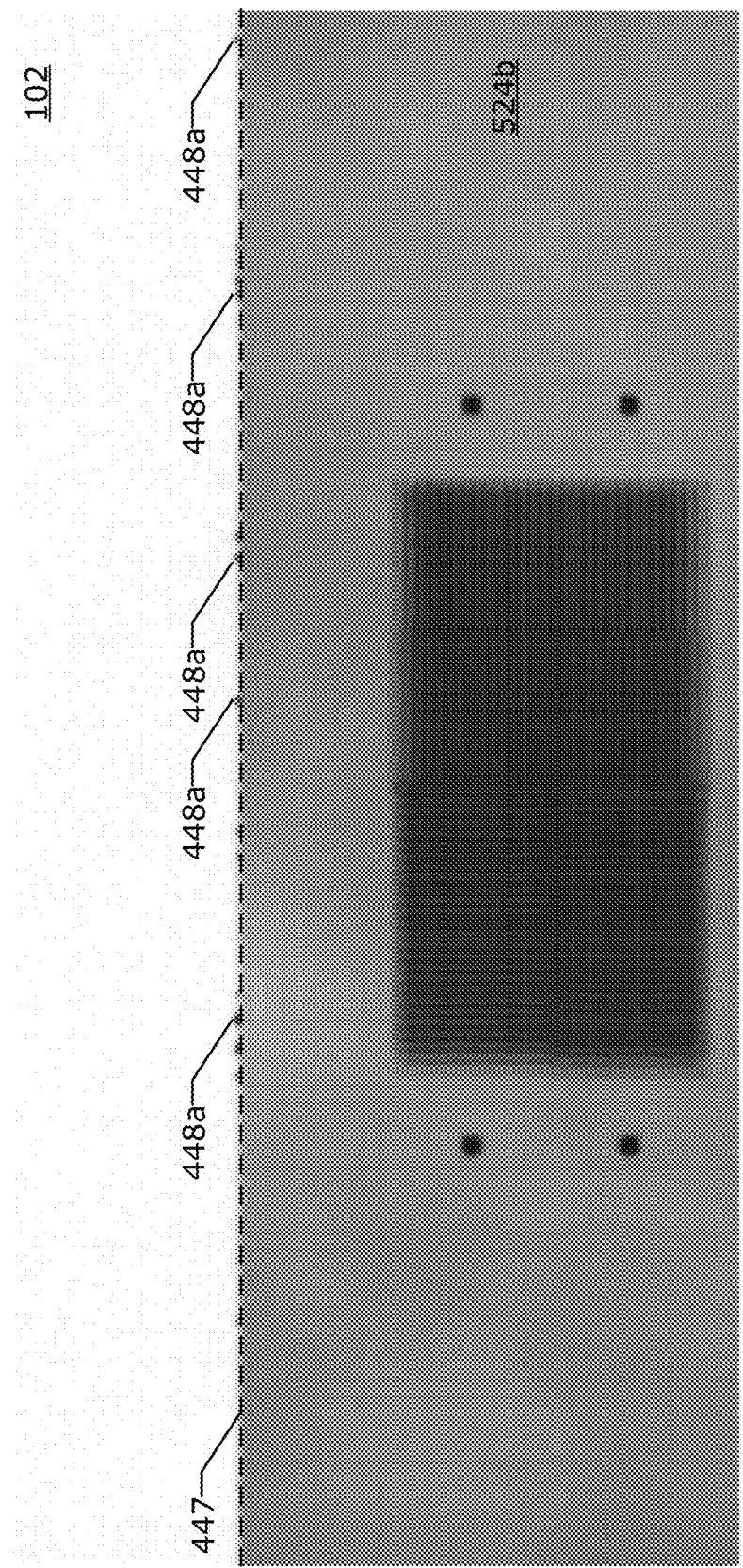
FIG. 4 is a micrograph illustrating extrusions on a substrate.

During the imprinting process 300, a single template 108 may be used to imprint a plurality of imprint fields over a plurality of substrates 102 (wafers) in a step and repeat process. During the imprinting process 300, the mesa sidewalls 246 are aligned with the imprint field edges 447 (dashed line). During the imprinting process 300, formable material 124 may form substrate extrusions 448a at the imprint field edge 447 on the substrate as illustrated by the micrograph in FIG. 4. The applicant has determined that these substrate extrusions 448a start out as template extrusions 448b (see FIG. 5D) on the mesa sidewalls 246. These template extrusions 448b on the mesa sidewalls 246 accumulate via one or both of seepage or vapor deposition. As illustrated in FIG. 2, the mesa sidewalls 246 separates the recessed surface 244 from the patterning surface 112. Over time these template extrusions 448b can grow and may eventually fall off and/or separate from the template, forming defects on the substrate 102 such as substrate extrusions 448a. These template extrusions 448b are formable material 124 that contaminate the mesa sidewalls 246. This tends to be a statistical process that starts at different times and positions on the mesa sidewalls 246 as the template is repeatedly used in the imprinting process 300 on one or more device yielding substrates 102.

Figure 5A:
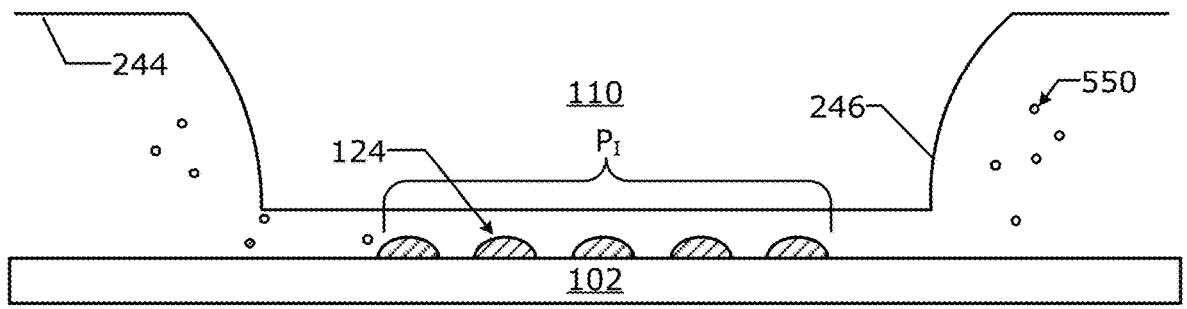
FIGS. 5A-D are illustrations of a template and substrate during the imprinting process and the template extrusions that the imprinting process produces.
Figure 5B:
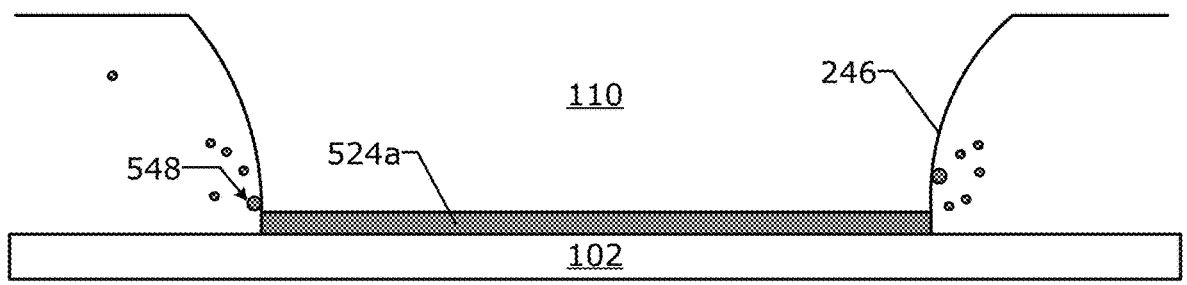

FIG. 5A is an illustration of a mesa 110 as it is about to come into contact with droplets of the formable material 124 on a substrate 102. The formable material 124 may have a vapor pressure which produces vapor 550. Over time the vapor 550 may deposit onto the mesa sidewalls 246, as illustrated in FIG. 5B, and eventually form a coating on the mesa sidewalls 246. FIG. 5B also illustrates the formation of a liquid layer 524a between the mesa 110 and the substrate 102. The imprinting drop pattern $P_I$ positions droplets, a sufficient distance from the mesa sidewalls 246, such that the formable material 124 may reach the imprint field edge 447 but does not seep out and come into contact with the mesa sidewalls 246.

Figure 5C:
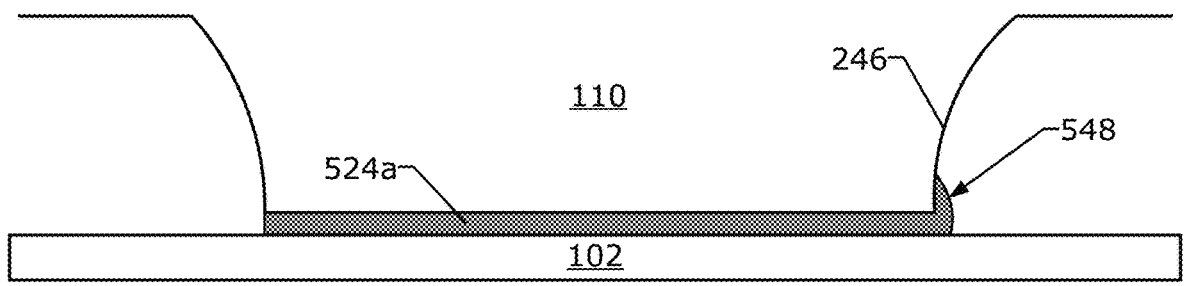
Figure 5D:
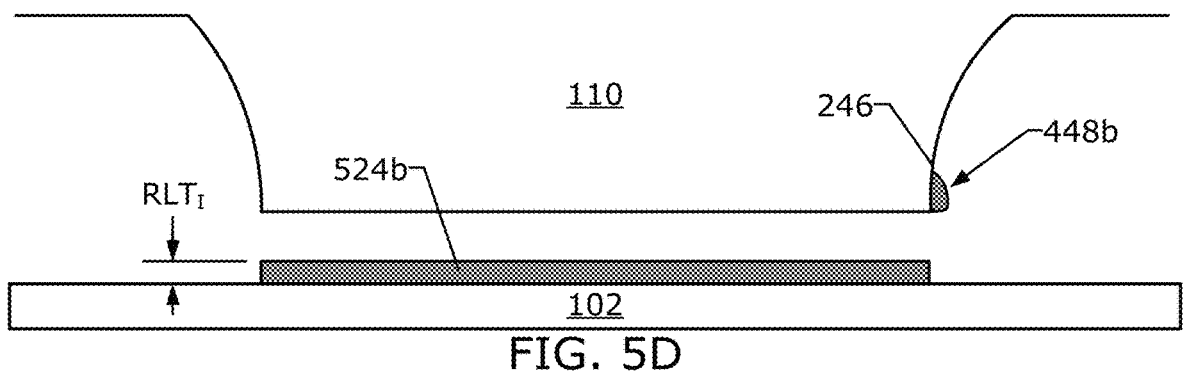

Even if the imprinting drop pattern $P_I$ is designed to eliminate the formation of substrate extrusions 448a, a small pre-cured template extrusion 548 may eventually form as illustrated in FIG. 5C. During the curing step S308 the liquid layer 524a is turned into a cured layer 524b. Also during the curing step S308, pre-cured template extrusions 548 may be solidified, forming a template extrusion 448b. During the separation step S310 the solidified small template extrusions 448b may stick the mesa sidewall 246 as illustrated in FIG. 5D.

The applicant has found that template extrusions 448b on the mesa sidewalls 246 do not necessarily create defects on the substrate 102 that affect the final devices produced from the substrate 102. Although small template extrusions 448b near the intersection of the mesa sidewalls 246 and the patterning surface 112 can create seeds for large extrusions, which can create meaningful defects.

Mesa Sidewall Cleaning Process

Figure 6:
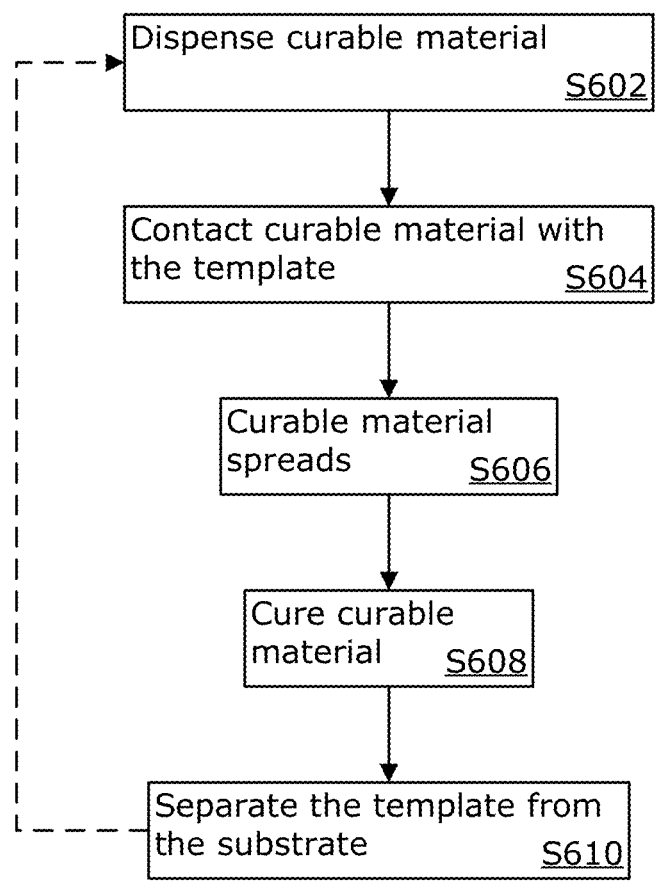
FIG. 6 is a flowchart illustrating an exemplary mesa sidewall cleaning process as used in an embodiment.

During or after the imprinting process 300 a mesa sidewall cleaning process 600 may be performed before the template extrusions 448b become too large as illustrated in FIG. 6. The mesa sidewall cleaning process 600 may be performed by: the nanoimprint lithography system 100; a modified nanoimprint lithography system 100a (not shown) that includes one or more additional components optimized to perform the mesa sidewall cleaning process 600; a specialized mesa sidewall cleaning system 100b (not shown) that includes one or more of the components that are similar to the nanoimprint lithography system 100.

Figure 7A:
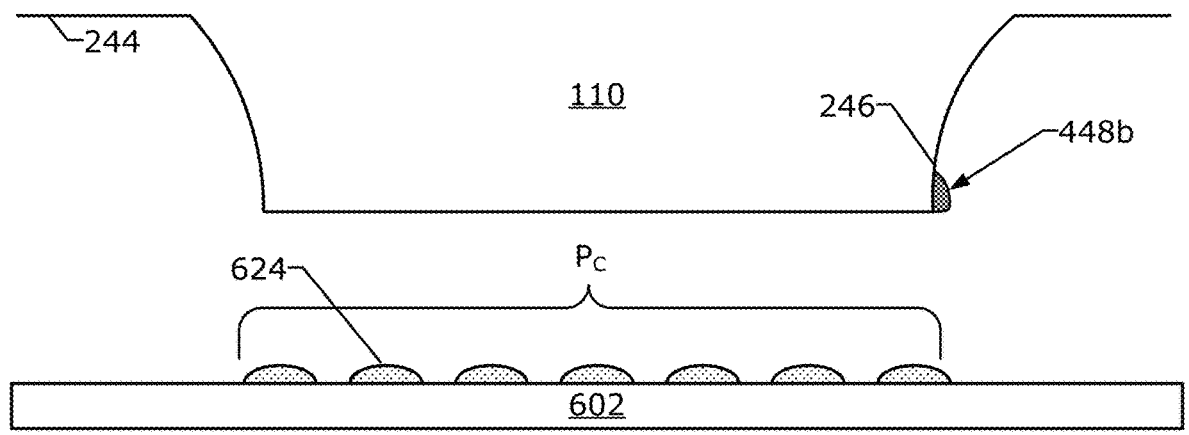
FIGS. 7A-C are illustrations of a template and substrate during the exemplary mesa sidewall cleaning process as used in an embodiment.

The mesa sidewall cleaning process 600 may include a dispensing step S602 that is substantially similar to the dispensing S302 described above. In an embodiment, during the dispensing step S602, the fluid dispenser 122 is configured to deposit a cleaning drop pattern $P_C$ of a curable material 624 onto an imprint field as illustrated in FIG. 7A. In an embodiment, the curable material 624 is identical to the formable material 124. In an alternative embodiment, the curable material 624 is a cleaning material that is formulated to stick to the template extrusions 448b on the mesa sidewalls 246.

In an embodiment, the imprint field is a non-yielding field on the substrate 102. In an embodiment, the imprint field is on a non-yielding substrate 602 that is loaded onto the substrate chuck 104. In an embodiment, the imprint field is on a non-yielding substrate 602 that is loaded onto a mesa sidewall cleaning chuck 604.

The mesa sidewall cleaning process 600 may also include a contacting step S604 that is substantially similar to the contacting step S304 described above. In an embodiment, the contacting step S604 is optimized for removing template extrusions 448b as opposed to filling features of the patterning surface 112. In an embodiment, during the contacting step S604 the positioning system is configured to contact the curable material 624 with the template 108. The positioning system is configured to control a relative position of the template to the cleaning drop pattern $P_C$ using one or more of: a first positioning stage for controlling a relative position of a substrate; the template chuck 118 configured to control a distribution of pressures applied to the back of the template chuck; an imprint head 120 for controlling a relative position of the template 108.

Figure 7B:
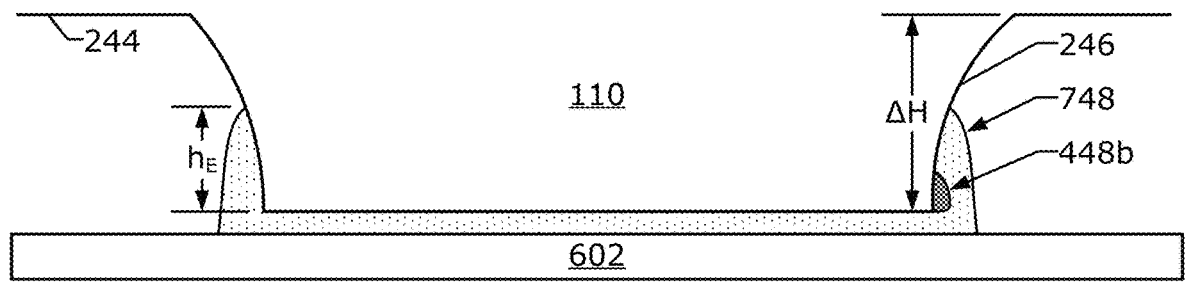

The mesa sidewall cleaning process 600 may also include a spreading step S606 that is substantially similar to the spreading step S306 described above. In an embodiment, the spreading step S606 may be optimized to spread the curable material 624 beyond the mesa sidewalls 240 so it can remove template extrusions 448b as opposed to preventing the formation of substrate extrusions 448a, as illustrated in FIG. 7B. In an embodiment, the flow of a purging gas (for example helium) is stopped at some point during the spreading step S306 for the imprinting process 300 to allow a cure inhibiting gas to diffuse towards the mesa sidewalls 246. In contrast, during the spreading step S606 of the mesa sidewall cleaning process 600 the flow of purging gas is not stopped at until after spreading step 606 and possibly after the curing step S608. During the spreading step S606 the relative position of template to the cleaning drop pattern $P_C$ is such that the curable material 624 spreads up the mesa sidewalls 246 encapsulating the template extrusions 448b without touching the recessed surface 244. The spatial distribution of droplets in the cleaning drop pattern $P_C$ also enables the curable material 624 to spread up the mesa sidewalls 246 encapsulating the template extrusions 448b without touching the recessed surface 244

The mesa sidewall cleaning process 600 may also include a curing step S608 that is substantially similar to the curing step S308 described above. In an embodiment, the curing step S608 is optimized for removing extrusions as opposed to creating features. In an embodiment, the curing step S608 for the mesa sidewall cleaning process 600 is optimized to have a longer exposure time than exposure time used during the curing step S308 for the imprinting process 300. In an embodiment, the curing step S608 for the mesa sidewall cleaning process 600 is optimized to expose the curable material to a dose of actinic radiation that is 125% to 200% of a dose of actinic radiation that is used in the curing step S308 used for the imprinting process 300.

In an embodiment, the curing step S608 for the mesa sidewall cleaning process 600 is optimized to flow helium during the curing step S608 and not during the curing step S308 for the imprinting process 300. In an embodiment, during the curing step S608 for the mesa sidewall cleaning process 600 a purging gas is flowed into region adjacent the mesa sidewall 246 to encourage curing, while during the curing step S308 for the imprinting process 300 the purging gas is not flowed into region adjacent the mesa sidewall 246 which inhibits the curing of extrusions that appear on the mesa sidewall allowing them to evaporate. In an embodiment, a purging gas is used during one or both of the mesa sidewall cleaning process 600 and the imprinting process 300.

Figure 7C:
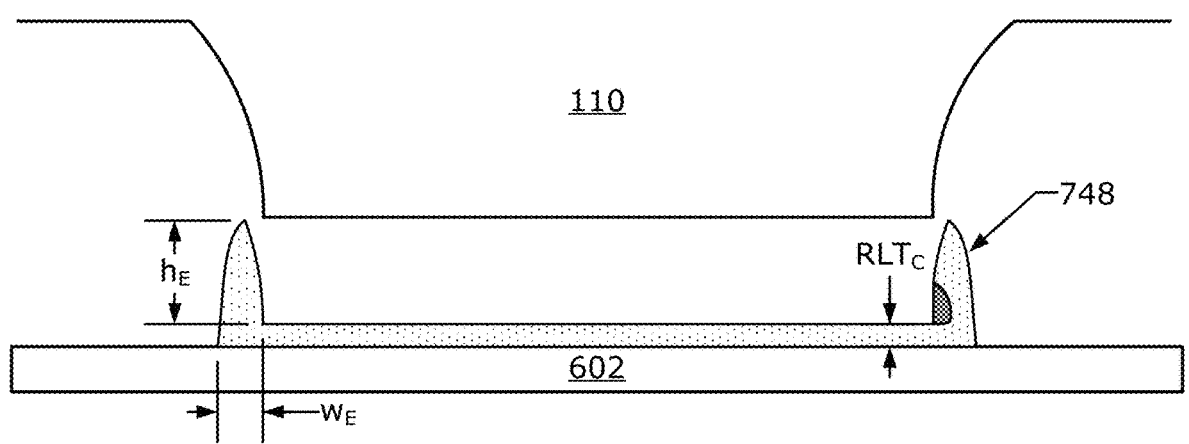

The mesa sidewall cleaning process 600 may also include a separation step S610 that is substantially similar to the separation step S310 described above. In an embodiment, the separation step S610 is optimized for removing extrusions from the mesa sidewalls 246 as opposed to creating features as illustrated in FIG. 7C. In an embodiment, after the separation step S610, the mesa sidewall cleaning process 600 stops and the imprinting process 300 continues. In an alternative embodiment, after the separation step S610, the mesa sidewall cleaning process 600 returns to step S602 and repeats the entire process 600 until the mesa sidewalls 246 meet a criteria that indicates that mesa sidewalls 246 are free of enough of template extrusions 448b to continue or return to the imprinting process 300. In an embodiment, the separation step S610 for the mesa sidewall cleaning process 600 is optimized to take a longer time than the separation step S310 for the imprinting process 300.

The cleaning drop pattern $P_C$ may be different from the imprinting drop pattern $P_I$. The cleaning drop pattern $P_C$ is designed to cause the curable material 624 to spread beyond the mesa sidewalls 246 during the spreading step S606, also the curing step S608 is timed so that curable material 624 has spread up the mesa sidewalls 246 but has not reached the recessed surface 244. In an embodiment, the curable material 624 spreads up the mesa sidewalls 246 a line extrusion height $h_E$, which is less than $\Delta H$ forming a line extrusion 748 as illustrated in FIG. 7B. In an embodiment, the line extrusion height $h_E$ is less than 2, 3, or 5 µm. In an embodiment, a line extrusion 748 overlaps with the template extrusion 448b stuck to the mesa sidewalls 246. In an embodiment, a height of the line extrusion 748 may be a function of a height of the substrate extrusions 448a. In an embodiment, a line extrusion 748 height is greater than 1 µm. In an embodiment, the average $RLT_C$ is thin, such as 20 nm, and depends on the cleaning drop pattern $P_C$. In an embodiment, the cleaning drop pattern $P_C$ has a higher density of drops applied near the imprint field edge 447, relative to the imprinting drop pattern $P_I$, in which case the average $RLT_C$ may not be changed much, but large line extrusions 748 are still generated. In an embodiment, the line extrusion height $h_E$ is less than some fraction of the mesa height (i.e. $h_E < \Delta H/2$). In an embodiment, the residual layer thickness of the cured formable material in the imprint field formed by the mesa sidewall cleaning process ($RLT_C$) is between 100 nm-200 nm.

In an embodiment, the mesa sidewall cleaning process 600 is configured to produce large line extrusions 748 of a specific size (line extrusion width $w_E$ and line extrusion height $h_E$). In an embodiment, the size of the large line extrusion 748 is measured after the mesa sidewall cleaning process 600 is performed on a substrate using either a contact or a non-contact profilometer. In an embodiment, the size of the large line extrusion 748 is a statistical parameter measured across one or more large line extrusions 748. In an embodiment, the specific size of the large line extrusion is determined based on a statistical analysis of substrate extrusions 448a that are obtained when the mesa sidewall cleaning process 600 is not performed and the imprinting process 300 is performed multiple times. In an embodiment, the large line extrusion 748 is larger than the largest measured substrate extrusion 448a. In an embodiment, the large line extrusion 748 is larger than a median plus three times a standard deviation of the measured substrate extrusions 448a. In an embodiment, the mesa sidewalls 246 are inspected for template extrusions 448b and before the mesa sidewall cleaning process 600 is performed, and the size of the large line extrusions 748 produced by the mesa sidewall cleaning process 600 are larger than the measured template extrusions 448b.

This mesa sidewall cleaning process 600 is configured to form large line extrusions 748 on the mesa sidewalls 246 as illustrated in FIGS. 7C and 8A. The applicant has found that large line extrusions 748 can encapsulate template extrusions 448b (see FIG. 7B) and remove them before they create defects (see FIG. 7C). The applicant has also found that if this mesa sidewall cleaning process 600 is performed intermittently between imprinting steps 300, then the life of the template can be extended without having a significant impact on throughput.

FIG. 8A is a micrograph of a large line extrusion 746 along a portion of the imprint field edge 447 on a substrate 602. FIG. 8B is a micrograph of a portion of an imprint field edge of the substrate 102 after imprinting with the template 108 that has been cleaned using the mesa sidewall cleaning process 600. Note that there are no substrate extrusions 448a. The applicant has also determined that this mesa sidewall cleaning process 600 can be performed without removing the template 108 from the template chuck 118.

In the mesa sidewall cleaning process 600 a large line extrusion 748 is intentionally created along the imprint field edge 447 on a non-yielding imprint field or a non-yielding substrate 602. In an embodiment, a line extrusion 748 is a continuous extrusion, one that has no breaks over a span of tens, hundreds, or thousands of microns along an imprint field edge 447. In an embodiment, the line extrusion 748 may be continuous along the entire perimeter of the mesa sidewalls 246. In an embodiment, a line extrusion 748 may be intentionally segmented or discontinuous at the imprint field edge 447 to target only certain locations or a particular edge of the mesa sidewalls. The large line extrusion 748 encases smaller, pre-existing template extrusions 448b (liquid or cured) that are attached to the mesa sidewalls 246.

In an embodiment, the large line extrusion 748 may have a wide base $w_E$ which is greater than 1 µm that is in contact with the substrate. In an embodiment, the wide base $w_E$ is adhered to the substrate through molecular bonds which form during the curing step S608. During the curing step S608, the large line extrusion 748 may react with and form molecular bonds with preexisting template extrusions 448b. Preexisting template extrusions 448b that are not covalently bonded to the large line extrusion 748 may be physically blanketed or covered by the large line extrusion 748. Weaker bonds and attractions may exist in this case (hydrogen bonds, Van der Waals forces, etc.). During the separation step S610, as the mesa sidewalls 246 slides up and away from the large line extrusion 748, pre-existing template extrusions 448b are trapped in the matrix of the large line extrusion 748 and are physically detached from the mesa sidewalls 246.

In an embodiment, the imprinting process 300 is performed with the template 108 on one or more imprint fields, on one or more substrates, then the mesa sidewall cleaning process 600 is performed on the template at least once before, the imprinting process 300 is performed again with the template 108 which now has less template extrusions 448b than prior to the mesa sidewall cleaning process 600. In an embodiment, the imprinting process 300 is performed with the template 108 on one or more imprint fields, on one or more substrates, then the mesa sidewall cleaning process 600 is done repeatedly (two, three, or four times) on the template 108 before, the imprinting process 300 is performed again with the template 108 which now has less template extrusions 448b than prior to the mesa sidewall cleaning process 600.

In an embodiment, the mesa sidewall cleaning process 600 may be applied after substrate extrusions 448a of a certain size are detected on the substrate 102. Extrusion detection results may be from an optical defect inspection system which may be sent to the processor 140. The processor 140 may then use the extrusion detection results to determine when it is appropriate to perform the mesa sidewall cleaning process 600, a template cleaning process, or a template change out. Examples of template cleaning processes are wet processes which may use liquid chemicals that react with the extrusions, to clean the template as a whole and dry processes which may use vacuum ultraviolet radiation, ozone, or plasma to clean the template as a whole.

In an embodiment, the mesa sidewall cleaning process 600 is applied before substrate extrusions 448b are detected on the substrate 102 in a pre-emptive measure to remove formable material accumulation sites that start to form and increase in size but have yet to be transferred to the substrate.

The applicant has found that the advantages of this mesa sidewall cleaning process 600 includes but are not limited to: the template 108 does not need to be removed from the template chuck 118; temperature of the template 108 is not substantially affected; and the patterning surface 112 is not substantially affected.

In an embodiment, the mesa sidewall cleaning process 600 might not return the mesa sidewalls 246 to a pristine condition as is the case is for cleaning methods that use chemical reactions to decompose the formable material 124 on the mesa sidewalls 246. Some residue from the large line extrusion 748 may be expected to remain on the mesa sidewalls 246.

The applicant has found that using this mesa sidewall cleaning process 600 while performing the imprinting process 300 across multiple substrates 102 produces an extrusion regeneration rate that is substantially similar to the extrusion regeneration rate when the mesa sidewalls 246 were pristine.

In an embodiment, a device yielding substrate (wafer) 102 is unloaded from the substrate chuck 104 a non-yielding substrate 602 is loaded onto the substrate chuck 104 which is then used to perform the mesa sidewall cleaning process 600. In an embodiment, the non-yielding substrate 602 is loaded onto substrate chuck 104 after all the fields on a device yielding substrate 102 have been imprinted. In an embodiment, the device yielding substrate 102 is unloaded from the substrate chuck 104 temporarily while the template 108 is subjected to the mesa sidewall cleaning process 600. In an embodiment, mesa sidewall cleaning process 600 is performed with a non-yielding portion of a device yielding substrate 102. In an embodiment, the mesa sidewall cleaning process 600 is performed on a non-yielding substrate 602 that is held in a mesa sidewall cleaning chuck 604 (not shown) which may be performed while one of: a device yielding substrate 102 is loaded onto the substrate chuck 104; in between fields being imprinted on the substrate that is on the substrate chuck 104; while formable material 124 is being dispensed onto an imprinting field of the substrate 102 that is on the substrate chuck 104.

In an embodiment, the mesa sidewall cleaning process 600 may be used with a template 108 that has a curved mesa sidewall, a second mesa, and/or a trench along the edge of the mesa 110. The mesa sidewall cleaning process 600 can be adjusted to control the filling of the gap and geometry of the large line extrusion 748.

In an embodiment, spin coating may be used to supply curable material 624 for both imprinting (shaping) and/or mesa sidewall cleaning 600. During the mesa sidewall cleaning process 600 the spin coater may be adjusted to spin the substrate at a cleaning spin speed that is slower than the imprinting spin speed used for imprinting (shaping).

In an embodiment, the formable material 124 used in the imprinting process 300 is different from the curable material 624 used in dispensing step S602. In an embodiment, the fluid dispenser 112 is configured to dispense different materials via different nozzles or dispense heads. In an embodiment, the fluid dispenser 122 includes fluid handling components configured to switch or adjust the material supplied to the nozzles and/or dispense heads.

In an embodiment, the curable material 624 is a thermoplastic polymer (for example poly(cyclohexyl acrylate). The thermoplastic polymer may also include a release agent. The entire mesa 110, a portion of the mesa, the entire mesa sidewall 246, or at least a portion of the mesa sidewall, is subject to the mesa sidewall cleaning process 600 and is brought into contact with the thermoplastic polymer. The thermoplastic polymer may be heated above the glass transition temperature $T_g$ of the thermoplastic polymer before or after the template is brought into contact with the thermoplastic polymer. The thermoplastic polymer may be heated via thermal radiation, heat conduction via the template chuck 118, and/or heat convection by adjusting the temperature of the gas in the local gas environment adjacent to the mesa sidewalls 246. After being heated above $T_g$ the thermoplastic polymer will flow over the template extrusions 448b. The temperature of the thermoplastic polymer may then be decreased. The template may then be separated from the thermoplastic polymer. The extrusions will adhere to the thermoplastic polymer instead of the mesa sidewalls 246 due to encapsulation.

In an embodiment, the flow of helium to the region between the template 108 and the substrate during the mesa sidewall cleaning process 600 is higher than the flow of helium to the region between the template 108 and the substrate during the imprinting process 300 such that large line extrusions 748 grow on the mesa sidewalls 246.

In an embodiment, during the dispensing step S602 the curable material 624 may be dispensed onto a substrate as a plurality of drops. In the context of the present application, the position and volume of these drop is referred to as the cleaning drop pattern $P_C$ used for the mesa sidewall cleaning process 600. While the position and volume of these drop is referred to as the imprinting drop pattern $P_I$ used for the imprinting process 300. In an embodiment, the pattern $P_C$ relative to the pattern $P_I$ may include: drops that are closer the mesa sidewalls 246; larger volume drops; or other variations such that a large line extrusion 748 is formed on the substrate. In an embodiment, the center of drops at the edge of the pattern $P_C$, are between 0-200 μm of the of the imprint field edge 447 which coincides with the mesa sidewalls 240 when the material is cured.

In an embodiment, the spread time during the spreading step S606 must be long enough to allow a large line extrusion 748 to form, but short enough to prevent the large line extrusion 748 from evaporating before it can be cured in the curing step S608. The spread time is dependent on many factors. For example, if the cleaning drop pattern $P_C$ includes outer drops that are bisecting the imprint field edge 447, then it is possible for the large line extrusion 748 to form as the edge of the patterning surface 112 contacts those outer drops. If these outer drops are farther from the imprint field edge 447, then it may take a 10-900 milliseconds to generate a large line extrusion 748. In an embodiment, the spread time may be from 10 ms-5 seconds without having a significant impact on throughput. In an embodiment, the spread time is set such that entire area under the patterning surface 112 is filled.

In an embodiment, the dose of actinic radiation used in step S608 is sufficient to polymerize the large line extrusion 748 such that the curable material 624 is no longer a liquid, it bonds to the substrate (which may include an adhesion layer), it bonds to the template extrusions 448b, and it has sufficient mechanical properties to prevent breakage at separation.

In an embodiment, the gas environment at the mesa sidewalls 246 may be controlled so as to affect the reaction rate and degree of crosslinking in the large line extrusion 748 that is formed in step S608. For example, if the polymerization rate of the curable material 624 is attenuated in the presence of oxygen, a substantially oxygen free environment may be created near the mesa sidewall 246. This may be accomplished by a non-oxygen gas or gas mixture may be introduced during the mesa sidewall cleaning process 600 to displace air from around near the mesa sidewalls 246.

In an embodiment, the size of the large line extrusion 748 is controlled by adjustment of the cleaning drop pattern $P_C$ such that the large line extrusion 748 is at least twice a height of a tallest template extrusion 448b on the mesa sidewall 246. In an embodiment, the line extrusions 748 should have a base width $w_E$ and height $h_E$ that are both greater than 1 μm, 2 μm, or 5 μm. The applicant has found that a mesa sidewall cleaning process 600 that creates a large line extrusion which 748 that is 3 μm tall and 3 μm wide is effective at removing most template extrusions 448b that are produced in an imprinting process 300 a sufficient size to entrap and remove them. The applicant has found that a large line extrusion having a minimum width to height ratio ($r_E := w_E/H_E$) that is greater than 0.5 and maybe 1 or 1.5 is effective at removing template extrusions 448b before they are transplanted to the substrate 102.

In an embodiment, the size of the large line extrusion 748 is controlled by through one or more of: configuration of the cleaning drop recipe pattern $P_C$; other imprint process conditions (for example: final imprinting force; and/or template back pressure); wetting angle of the curable material; properties of the non-yielding substrate; properties of the non-yielding field; and properties of an adhesion layer. The curable material 624 may have the ability to wet, coat, and cover template extrusions 448b on the mesa sidewalls 246.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method to clean mesa sidewalls of a template, comprising:
   depositing a curable material in a cleaning drop pattern onto an imprint field of a substrate selected from the group consisting of: a device yielding substrate and a non-yielding substrate;
   contacting the curable material with the template, wherein the template has:
   a recessed surface;
   a mesa extending from the recessed surface;
   mesa sidewalls that surround the mesa wherein template extrusions of cured formable material are present on the mesa sidewalls; and
   wherein the mesa sidewalls connect the recessed surface to the mesa;
   wherein, a relative position of the template to the cleaning drop pattern is such that the curable material spreads up the mesa sidewalls and does not contact the recessed surface;
   encapsulating the template extrusions on the mesa sidewalls as the curable material spreads up the mesa sidewalls;
   forming cured material by exposing the curable material to actinic radiation after the curable material has spread up the mesa sidewalls, and before the curable material contacts the recessed surface; and
   removing the template extrusions from the mesa sidewalls by separating the template from the cured material.

2. The method according to claim 1, further comprising imprinting a plurality of imprint fields on the device yielding substrate, wherein imprinting a particular imprint field on the device yielding substrate comprises:
   depositing formable material onto the particular imprint field;
   contacting the formable material with the template;
   exposing the formable material to actinic radiation to form the cured formable material on the device yielding substrate and contaminating the mesa sidewalls with the cured formable material; and separating the template from the cured formable material; and wherein prior to the template contacting the curable material, the mesa sidewalls are contaminated with the template extrusions that include a first amount of the cured formable material, and wherein after the template is separated from the cured material, the mesa sidewalls are contaminated with less than the first amount of the cured formable material.

3. The method according to claim 1, wherein the non-yielding substrate is a semiconductor wafer.

4. The method according to claim 2, wherein the curable material is identical to the formable material.

5. The method according to claim 2, wherein the cured material forms line extrusions along the mesa sidewalls.

6. The method according to claim 5, wherein the template extrusions have a height between 200 nm to 2 µm.

7. The method according to claim 5, wherein the line extrusions have a width of 1-4 µm.

8. The method according to claim 5, wherein the line extrusions have a height that is less than half a mesa height of the template and greater than a height of the template extrusions.

\* \* \* \* \*